(12) United States Patent
Lim et al.

(10) Patent No.: US 8,765,587 B2
(45) Date of Patent: Jul. 1, 2014

(54) METHOD OF MANUFACTURING NON-VOLATILE MEMORY DEVICES

(75) Inventors: Su Hyun Lim, Seoul (KR); Seung Cheol Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 203 days.

(21) Appl. No.: 13/398,235

(22) Filed: Feb. 16, 2012

(65) Prior Publication Data

US 2012/0214298 A1 Aug. 23, 2012

(30) Foreign Application Priority Data

Feb. 17, 2011 (KR) .................. 10-2011-0014211

(51) Int. Cl.
*H01L 21/3205* (2006.01)
*H01L 21/302* (2006.01)
(52) U.S. Cl.
USPC .......................................... 438/587; 438/734
(58) Field of Classification Search
None
See application file for complete search history.

(56) References Cited

U.S. PATENT DOCUMENTS

2009/0253243 A1* 10/2009 Cho et al. ...................... 438/437

FOREIGN PATENT DOCUMENTS

| JP | 2002 030470 A | * | 1/2002 | ................ C23F 4/00 |
|---|---|---|---|---|
| KR | 1020080009856 | | 1/2008 | |
| KR | 1020100076333 | | 7/2010 | |

OTHER PUBLICATIONS

NPL: JP 2002030470 A, Hitachi Ltd. (Katsuji et al.), English Abstract, document published Jan. 31, 2002.*
NPL: JP 2002030470 A, Hitachi Ltd. (Katsuji et al.), Machine Translation, document published Jan. 31, 2002.*
Office Action issued from the Korean Intellectual Property Office on Apr. 24, 2012.
Notice of Allowance issued by the Korean Intellectual Property Office on Oct. 8, 2012.

* cited by examiner

*Primary Examiner* — Scott B Geyer
(74) *Attorney, Agent, or Firm* — IP & T Group LLP

(57) ABSTRACT

A method of manufacturing non-volatile memory devices includes forming a gate insulating layer and a first conductive layer over a semiconductor substrate, etching the first conductive layer and the gate insulating layer to expose part of the semiconductor substrate, forming trenches at a target depth of the semiconductor substrate by repeatedly performing a dry etch process for etching the exposed semiconductor substrate and a cleaning process for removing residues generated in the dry etch process, forming isolation layers within the trenches, forming a dielectric layer on a surface of the entire structure in which the isolation layers are formed, and forming a second conductive layer on the dielectric layer.

18 Claims, 5 Drawing Sheets

METHOD OF MANUFACTURING NON-VOLATILE MEMORY DEVICES

CROSS-REFERENCE TO RELATED APPLICATION

Priority to Korean patent application number 10-2011-0014211 filed on Feb. 17, 2011, the entire disclosure of which is incorporated by reference herein, is claimed.

BACKGROUND

Exemplary embodiments relate to a method of manufacturing non-volatile memory devices and, more particularly, to a method of forming trenches for isolation.

FIG. 1 is a photograph illustrating known features of a conventional non-volatile memory device.

As non-volatile memory devices are manufactured with a higher degree of integration, a stack layer GP for a gate has narrower width, but becomes higher.

The stack layer GP is formed by forming a plurality of stack layers, including a gate insulating layer, a conductive layer for floating gates, and a hard mask layer, over a semiconductor substrate and then patterning the stack layers. After the stack layers are formed, part of the semiconductor substrate exposed between the stack layers is etched to form trenches for isolation.

An etch process for forming the trenches for isolation is performed using a dry etch process. Here, fumes 10 may be formed because by-products generated during the dry etch process are stagnated. If a cleaning process for removing the fumes 10 is performed after the trenches are formed, it takes relatively long time to fully remove the fumes 10 stagnated while the trenches are formed, thereby increasing time of manufacturing a non-volatile memory device. In particular, since tension between a cleaning solution used in the cleaning process and the stack layers GP is increased, the stack layers GP may be inclined (refer to a photograph (A) of FIG. 1). If the stack layers GP are inclined, the yield of the non-volatile memory device is lowered because the adjacent stack layers GP may be interconnected. If a cleaning process is not performed for preventing the occurrence of this inclination phenomenon, the non-volatile memory device may be manufactured with defects at the portions where the fumes are generated as shown in a photograph (B) of FIG. 1, thereby reducing the yield.

BRIEF SUMMARY

According to exemplary embodiments, by-products are prevented from being generated due to fumes on a surface of stack layers for gates and the stack layers are prevented from being inclined by forming trenches for isolation through a plurality of dry etch processes and cleaning processes.

A method of manufacturing non-volatile memory devices according to exemplary embodiment of the present invention includes forming a gate insulating layer and a first conductive layer over a semiconductor substrate; etching the first conductive layer and the gate insulating layer to expose part of the semiconductor substrate; forming trenches at a target depth of the semiconductor substrate by repeatedly performing a dry etch process for etching the exposed semiconductor substrate and a cleaning process for removing residues generated in the dry etch process; forming isolation layers within the trenches; forming a dielectric layer on a surface of the entire structure in which the isolation layers are formed; and forming a second conductive layer on the dielectric layer.

A method of manufacturing non-volatile memory devices according to another exemplary embodiment of the present invention includes forming a gate insulating layer and a first conductive layer over a semiconductor substrate; etching the first conductive layer and the gate insulating layer to expose part of the semiconductor substrate; forming trenches having a first depth shallower than a target depth by repeatedly performing a primary dry etch process for etching the exposed semiconductor substrate and a wet cleaning process for removing residues generated in the primary dry etch process; performing a secondary dry etch process for the trenches to have the target depth; performing a dry cleaning process for removing residues generated in the secondary dry etch process; forming isolation layers within the trenches; forming a dielectric layer on a surface of the entire structure in which the isolation layers are formed; and forming a second conductive layer on the dielectric layer.

A method of manufacturing non-volatile memory devices according to yet another exemplary embodiment of the present invention includes forming stack layers over a semiconductor substrate; forming mask patterns on the stack layers; repeating a dry etch process and a wet cleaning process in order to etch the stack layer exposed between the mask patterns up to a first depth; and patterning the stack layers to be etched up to a target depth by performing a dry etch process when the stack layers are etched up to the first depth.

DESCRIPTION OF EMBODIMENTS

Hereinafter, some exemplary embodiments of the present disclosure will be described in detail with reference to the accompanying drawings. The figures are provided to enable those of ordinary skill in the art to make and use the present invention according to the exemplary embodiments of the preset invention.

FIGS. 2A to 2I are cross-sectional views illustrating a method of manufacturing non-volatile memory devices according to the present invention.

Figure 1:
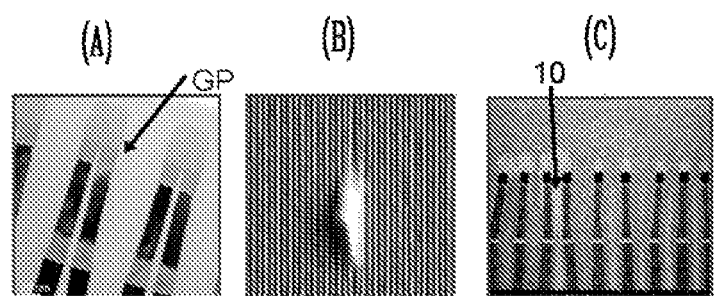
FIG. 1 is a photograph illustrating known features of a conventional non-volatile memory device.
Figure 2A:
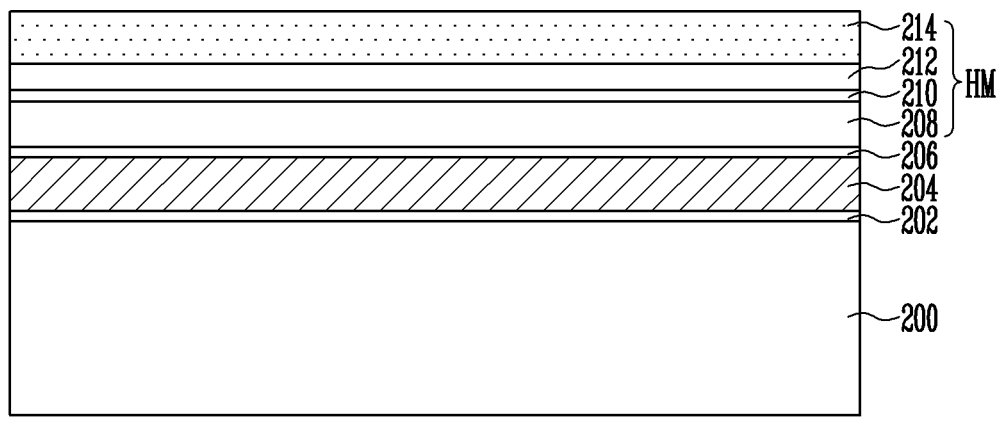
FIGS. 2A to 2L are cross-sectional views illustrating a method of manufacturing non-volatile memory devices according to the present invention.

Referring to FIG. 2A, a gate insulating layer 202, a first conductive layer 204 for floating gates, a buffer layer 206, and a hard mask layer HM are sequentially formed over a semiconductor substrate 200. The hard mask layer HM includes a nitride layer 208 for isolation, an oxide layer 210, a SiON layer 212, and a conductive layer 214 which are sequentially formed. Before forming the gate insulating layer 202, a screen insulating layer (not shown) formed of an oxide layer may be further formed on the semiconductor substrate 200. The gate insulating layer 202 may be formed of an oxide layer, and the first conductive layer 204 formed of a polysilicon layer. Although only the section of a cell region is shown in the drawing, a gate insulating layer for high voltage transistors may be further formed over the semiconductor substrate 200 in a peripheral region (not shown) before forming the first conductive layer 204. The first conductive layer 204 may be formed to have a thickness of 500 Å to 1000 Å, and the nitride layer 208 for isolation may be formed to have a thickness of 100 Å to 300 Å. Each of the oxide layer 210, the SiON layer 212, and the conductive layer 214 may be formed to have a thickness of 500 Å to 1000 Å.

Figure 2B:
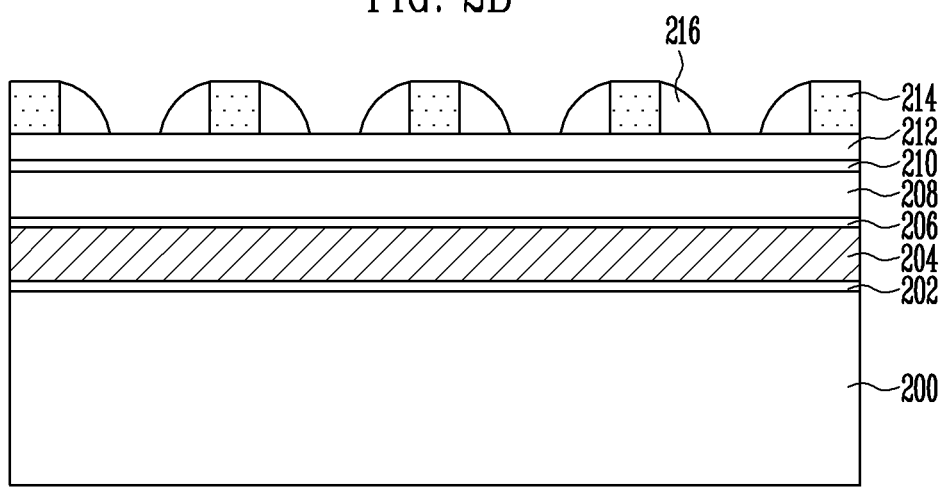

Referring to FIG. 2B, photoresist patterns (not shown) for defining regions where trenches will be formed is formed. The photoresist patterns may be formed so that opening portions are formed in the regions where the trenches will be formed or they may be formed by performing a double patterning process. An example that the photoresist patterns are formed by performing the double patterning process is described below. In the double patterning process, the photoresist patterns having a wider pitch than patterns to be finally formed are formed. The conductive layer 214 exposed between the photoresist patterns is patterned. Spacers 216 are formed on the sidewalls of the patterned conductive layers 214. The spacers 216 are made of materials having a different etch selectivity from the materials of the conductive layer 214 and may be formed of a nitride layer or an oxide layer. The trench for isolation will be subsequently formed in an area between the spacers 216.

Figure 2C:
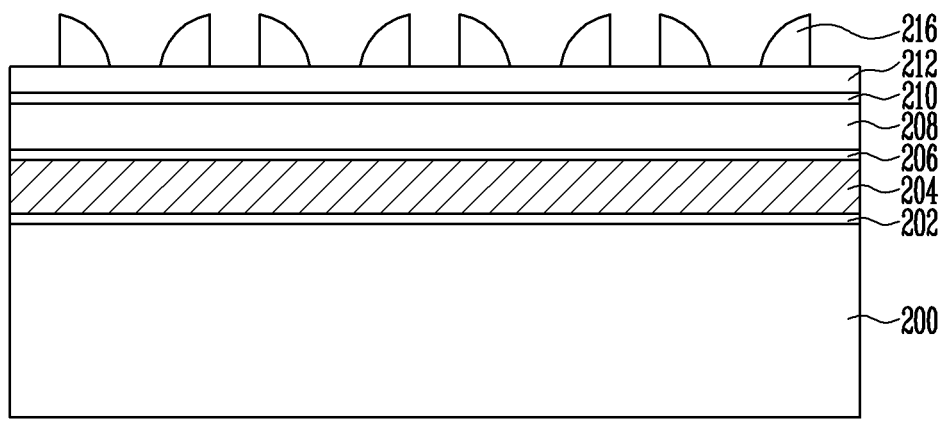

Referring to FIG. 2C, the conductive layers 214 are removed to expose the SiON layer 212 between the spacers 216.

Figure 2D:
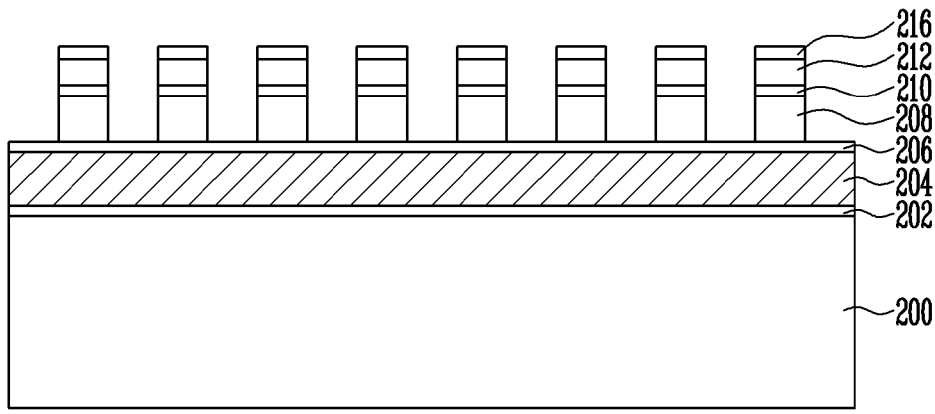

Referring to FIG. 2D, the SiON layer 212, the oxide layer 210, and the nitride layer 208 for isolation are patterned by performing an etch process using the spacers 216 as hard masks. The buffer layer 206 may be exposed or partially removed between the patterned stack layers.

Figure 2E:
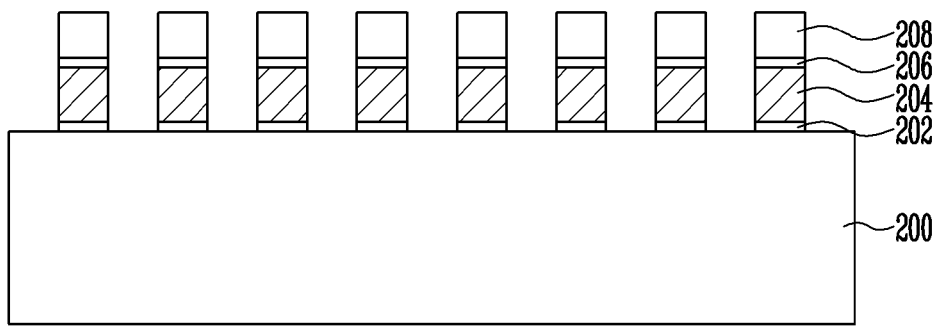

Referring to FIG. 2E, the buffer layer 206, the first conductive layer 204, and the gate insulating layer 202 are patterned by performing an etch process using the remaining spacers 216, the remaining SiON layers 212, the remaining oxide layers 210, and the remaining nitride layers 206 as hard mask patterns. While the buffer layer 206, the first conductive layer 204, and the gate insulating layer 202 are patterned, the spacers 216, the SiON layers 212, and the oxide layers 210 are removed.

Figure 2F:
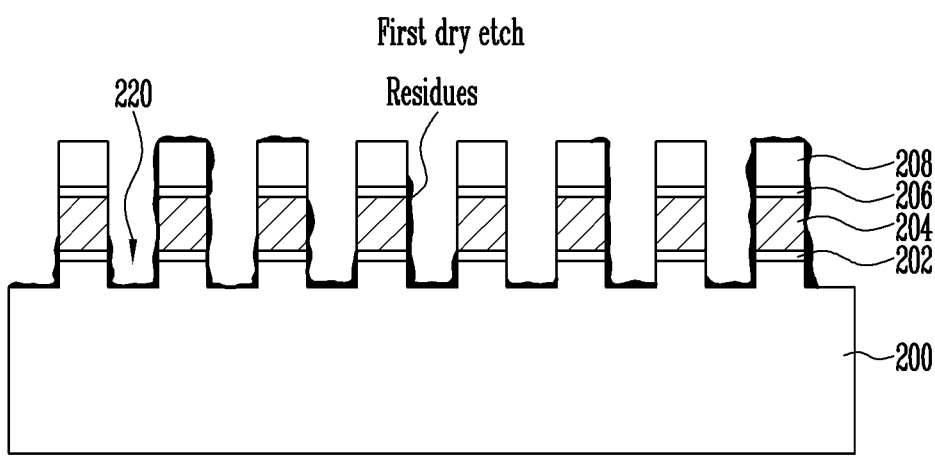

Referring to FIG. 2F, trenches 220 are formed in the exposed semiconductor substrate 200 by performing a first dry etch process using the remaining nitride layers 206 as etch masks. In the first dry etch process, the trenches 220 are formed to have a shallower depth than a final target depth. If a dry etch process is performed, residues due to the dry etch process may remain on a surface of the entire structure.

Figure 2G:
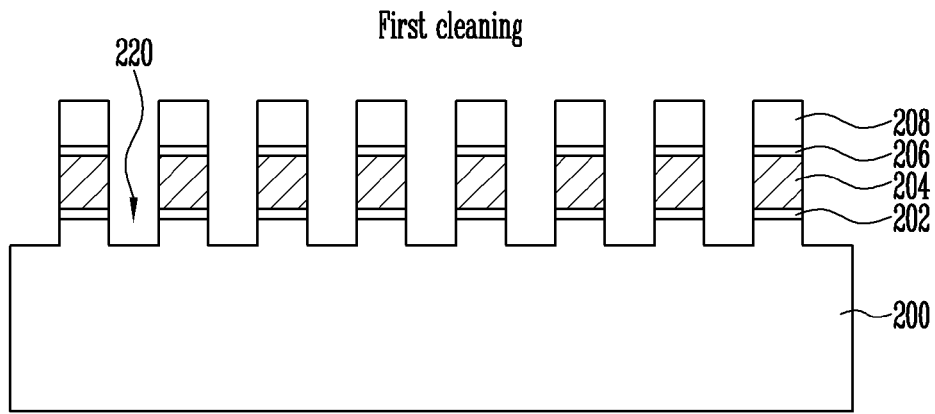

Referring to FIG. 2G, a first cleaning process for removing the remaining by-products is performed. The first cleaning process includes a wet cleaning process and a dry cleaning process. According to an example, the wet cleaning process is first performed and then the dry cleaning process is performed. The first cleaning process is performed in order to remove the by-products while maintaining the depth of the trenches 220 formed in the first dry etch process. The wet cleaning process may be performed using any one of an $H_2SO_4$ solution and a Standard Cleaning (SC)-1 solution or a mixture of them. In some embodiments, the wet cleaning process may be performed by loading the semiconductor substrate into single type equipment and supplying isoprophil alcohol (IPA) to the semiconductor substrate. In order to increase the efficiency of the first cleaning process, a temperature of the IPA is raised to 50° C. to 80° C. To this end, the temperature of 50° C. to 80° C. may be reached by preheating a nozzle for spraying the IPA. The first dry cleaning process is performed using a mixed gas of nitrogen (N) and argon (Ar). If, for example, only the wet cleaning process is performed, an etchant may not reach the bottom of the patterns owing to surface tension because an interval between the patterns is narrowed by an increase of the degree of integration. In this case, the by-products remaining in portions where the etchant is not reached may be removed by performing a subsequent dry cleaning process. It is preferred that the wet cleaning process of the first cleaning process be performed until the trenches are formed at a depth such that the patterns may be inclined by the cleaning solution and the wet cleaning process be not performed when the trenches are formed at a target depth deeper than such the depth.

Figure 2H:
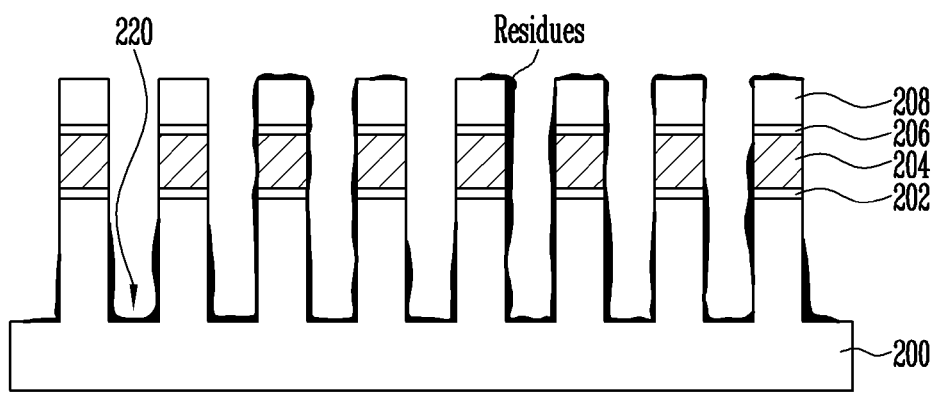
Figure 2I:
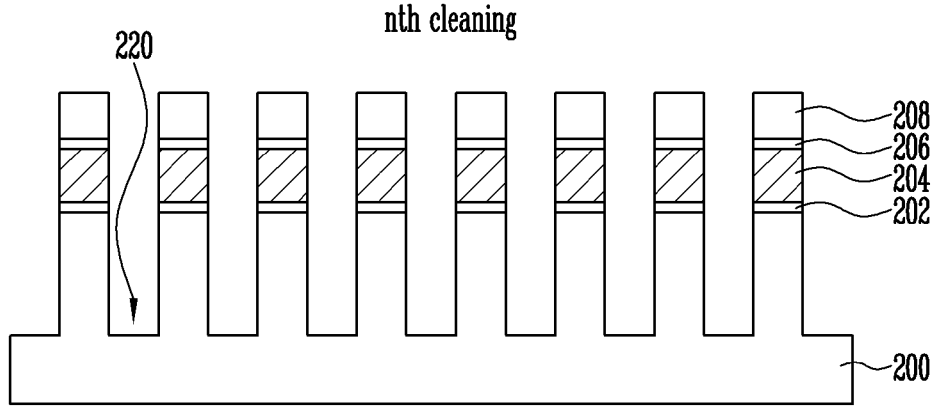

Referring to FIGS. 2H and 2I, an $n^{th}$ dry etch process (FIG. 2H) and an $n^{th}$ cleaning process (FIG. 2I) are performed. That is, the trenches 220 may be formed to have the final target depth by repeatedly performing processes, such as the first dry etch process of increasing the depth of the trenches 220 and the first cleaning process of removing the by-products, as described above with reference to FIGS. 2F and 2G.

In particular, the last process of completing the trenches 220 is performed using a dry cleaning process so that residues are removed and, at the same time, the patterns are prevented from being inclined owing to the solution used in the wet cleaning process.

Figure 2J:
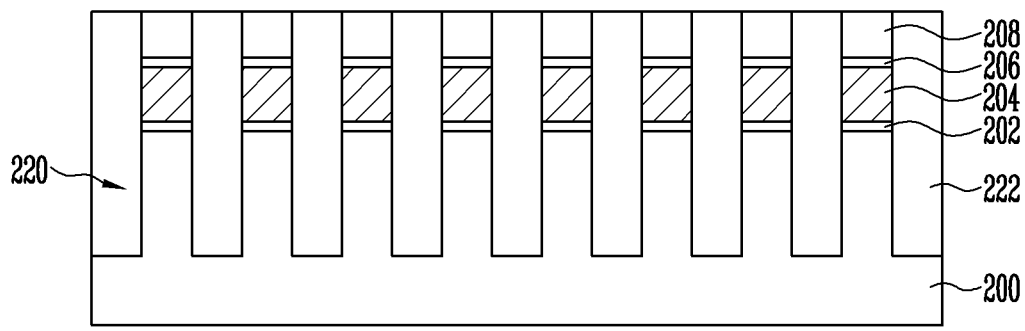

Referring to FIG. 2J, isolation layers 222 are formed by filling an insulating material in the trenches 220. Before forming the isolation layers 222, a liner oxide layer (not shown) may be formed on a surface of the entire structure in which the trenches 220 are formed. The insulating material for the isolation layers 222 is an oxide layer and may be any one of, for example, a High Density Plasma (HDP) layer and a Spin On Dielectric (SOD) layer or a stack of them.

Figure 2K:
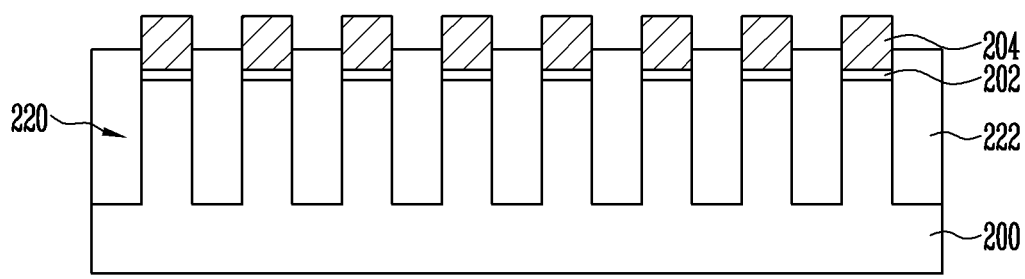

Referring to FIG. 2K, the nitride layers 208 and the buffer layers 206 are removed, and the height of the isolation layers 222 is lowered by performing an etch process. Here, the height of the isolation layers 222 is lowered, but the gate insulating layers 202 are not exposed.

Figure 2L:
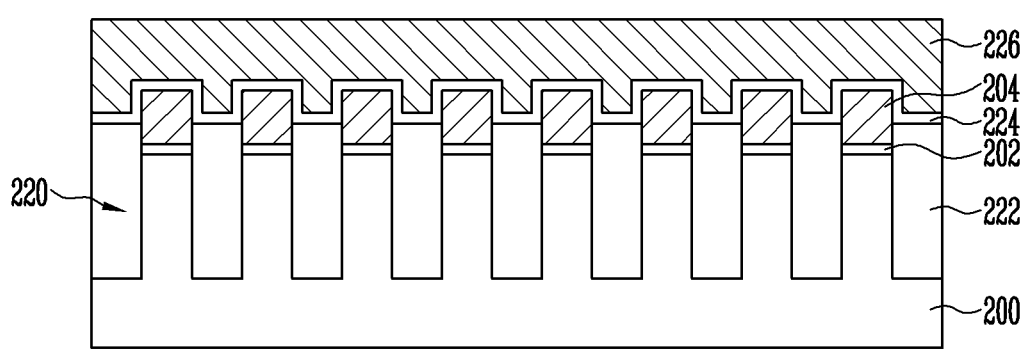

Referring to FIG. 2L, a dielectric layer 224 and a second conductive layer 226 for control gates are formed on the entire surface including the isolation layers 220 and the first conductive layers 204. The dielectric layer 224 is formed by sequentially stacking an oxide layer, a nitride layer, and an oxide layer or formed of a high dielectric (high-k) layer. The second conductive layer 226 is formed of a polysilicon layer.

Next, a gate pattering process is performed.

In order to perform the gate patterning process, mask patterns (not shown) are formed on the second conductive layer 226, and the stack layers (i.e., the second conductive layer 226, the dielectric layers 224, the first conductive layers 204, and the gate insulating layers 202) exposed between the mask patterns are sequentially etched. Here, an etching depth of making the patterned stack layers inclined is measured, the dry etch process and the wet cleaning process are repeatedly performed up to the measured depth, and the gate patterning process using only the dry etch process is performed after the measured depth is reached.

As described above, a phenomenon that the patterns are inclined when the trenches 220 are formed may be prevented from occurring and residues resulting from the etch process may also be removed because the trenches 220 are formed by repeatedly performing the dry etch process and the cleaning process. Consequently, the yield of a semiconductor manufacturing process may be increased, and reliability of semiconductor devices may be increased.

According to embodiments of the present invention, since by-products generated owing to an etch process may be prevented from being thickly stagnated, the time taken to perform a cleaning process for removing the by-products may be reduced. Accordingly, the stack layers for gates may be prevented from being inclined when the trenches for isolation are formed. Consequently, the yield of a process of manufacturing non-volatile memory devices may be increased, and reliability of the non-volatile memory devices may be increased.

What is claimed is:

1. A method of manufacturing non-volatile memory devices, comprising:
   forming a gate insulating layer and a first conductive layer over a semiconductor substrate;
   etching the first conductive layer and the gate insulating layer to expose part of the semiconductor substrate;
   forming trenches at a target depth of the semiconductor substrate by repeatedly performing a dry etch process for etching the exposed semiconductor substrate and a cleaning process for removing residues generated in the dry etch process, wherein the cleaning process includes a wet cleaning process and a dry cleaning process;
   forming isolation layers within the trenches;
   forming a dielectric layer on a surface of an entire structure in which the isolation layers are formed; and
   forming a second conductive layer on the dielectric layer.

2. The method of claim 1, wherein the dry etch process is performed to etch the exposed semiconductor substrate deeper.

3. The method of claim 1, wherein the cleaning process is performed to remove the residues while maintaining an etch depth of the semiconductor substrate.

4. The method of claim 1, wherein the cleaning process includes a wet cleaning process while the semiconductor substrate is etched up to a set depth shallower than the target depth in the dry etch process.

5. The method of claim 1, wherein the wet cleaning process is performed using an $H_2SO_4$ solution.

6. The method of claim 1, wherein the wet cleaning process is performed by loading the semiconductor substrate into single type equipment and supplying isoprophil alcohol (IPA) to the semiconductor substrate.

7. The method of claim 6, wherein the IPA has a temperature of 50° C. to 80° C.

8. The method of claim 7, wherein the temperature is reached by preheating a nozzle for spraying the IPA.

9. The method of claim 1, wherein the dry cleaning process is performed using a mixed gas of nitrogen (N) and argon (Ar).

10. The method of claim 1, wherein the first conductive layer is formed of a polysilicon layer of 500 Å to 1000 Å in thickness.

11. The method of claim 1, wherein the second conductive layer is formed of a polysilicon layer.

12. A method of manufacturing non-volatile memory devices, comprising:
    forming a gate insulating layer and a first conductive layer over a semiconductor substrate;
    etching the first conductive layer and the gate insulating layer to expose part of the semiconductor substrate;
    forming trenches having a first depth shallower than a target depth by repeatedly performing a primary dry etch process for etching the exposed semiconductor substrate and a wet cleaning process for removing residues generated in the primary dry etch process;
    performing a secondary dry etch process for the trenches to have the target depth;
    performing a dry cleaning process for removing residues generated in the secondary dry etch process;
    forming isolation layers within the trenches;
    forming a dielectric layer on a surface of an entire structure in which the isolation layers are formed; and
    forming a second conductive layer on the dielectric layer.

13. The method of claim 12, wherein the wet cleaning process is performed using an $H_2SO_4$ solution.

14. The method of claim 12, wherein the wet cleaning process is performed by loading the semiconductor substrate into single type equipment and supplying isoprophil alcohol (IPA) to the semiconductor substrate.

15. The method of claim 12, wherein the first depth is a depth such that patterns formed between the trenches by etching the exposed semiconductor substrate in the primary dry etch process are prevented from being inclined in the wet cleaning process.

16. A method of manufacturing non-volatile memory devices, comprising:
    forming stack layers over a semiconductor substrate, wherein the stack layers comprise a gate insulating layer, a first conductive layer for floating gates, a dielectric layer, and a second conductive layer for control gates;
    forming mask patterns on the stack layers;
    repeating a dry etch process and a wet cleaning process to etch the stack layer exposed between the mask patterns up to a first depth; and
    patterning the stack layers to be etched up to a target depth by performing a dry etch process when the stack layers are etched up to the first depth.

17. The method of claim 16, wherein the wet cleaning process is performed using an $H_2SO_4$ solution.

18. The method of claim 16, wherein the wet cleaning process is performed by loading the semiconductor substrate into single type equipment and supplying isoprophil alcohol (IPA) to the semiconductor substrate.

* * * * *